United States Patent
Wu

(10) Patent No.: US 7,479,444 B2
(45) Date of Patent: Jan. 20, 2009

(54) METHOD FOR FORMING SCHOTTKY DIODES AND OHMIC CONTACTS IN THE SAME INTEGRATED CIRCUIT

(75) Inventor: Schyi-yi Wu, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 239 days.

(21) Appl. No.: 11/421,707

(22) Filed: Jun. 1, 2006

(65) Prior Publication Data

US 2007/0281451 A1    Dec. 6, 2007

(51) Int. Cl.
    *H01L 21/28*    (2006.01)
    *H01L 21/44*    (2006.01)
(52) U.S. Cl. ..................... 438/570; 438/571
(58) Field of Classification Search .......... 438/570, 438/571, 582
    See application file for complete search history.

(56) References Cited

U.S. PATENT DOCUMENTS

2001/0019879 A1*    9/2001    Kravtchenko et al. ....... 438/570

FOREIGN PATENT DOCUMENTS

JP    2000-340750    12/2000

\* cited by examiner

*Primary Examiner*—Phuc T Dang
(74) *Attorney, Agent, or Firm*—Patent Law Group LLP; Carmen C. Cook

(57) ABSTRACT

A method for forming an ohmic contact and a Schottky diode in an integrated circuit includes providing a semiconductor substrate; forming first and second diffusion regions in the semiconductor substrate; forming an insulating layer on the semiconductor substrate; forming a first contact opening in the insulating layer and over the first diffusion region to expose the semiconductor substrate; forming a barrier metal layer on the insulating layer and in the first contact opening; forming a second contact opening in the barrier metal layer and the insulating layer to expose the semiconductor substrate where the second contact opening is formed over the second diffusion region; forming a metal layer on the barrier metal layer and the insulating layer and in the first and second contact openings where the metal layer includes a metal that forms a Schottky barrier junction with the semiconductor substrate; and patterning the metal layer to form the ohmic contact over the first diffusion region and the Schottky diode over the second diffusion region.

13 Claims, 10 Drawing Sheets

METHOD FOR FORMING SCHOTTKY DIODES AND OHMIC CONTACTS IN THE SAME INTEGRATED CIRCUIT

FIELD OF THE INVENTION

The invention relates to integrated circuit fabrication processes and, in particular, to a method for forming Schottky diodes and ohmic contacts in the same integrated circuit.

DESCRIPTION OF THE RELATED ART

Semiconductor fabrication processes use metallization contact structures to form electrical connection to diffusion regions formed in the semiconductor substrate. The low resistance electrical connection between the overlying metallization layer and the silicon substrate is referred to as an ohmic contact.

In mature fabrication process technologies, the metallization contact structure is formed by depositing aluminum in contact openings and allowing the aluminum to make direct contact with the silicon. However, in some cases, aluminum spiking becomes a concern and fabrication processes began to include one or more barrier metal layers in the metallization contact structure. Barrier metals that have been used in modern fabrication processes include certain refractory metals, such as Tungsten (W), Titanium (Ti), or an alloy of the refractory metals, such as Titanium Nitride (TiN) or Titanium Tungsten (TiW). The barrier metal layer is used to prevent aluminum from directly contacting the silicon surface. The refractory metals form silicide when they are placed in contact with silicon. For example, tungsten forms tungsten silicide while titanium forms titanium silicide when the metals are in contact with the silicon substrate.

In deep submicron technologies (typically 0.5 μm and below) aluminum cannot adequately cover the contact openings, and the industry has gone to the use of tungsten plugs. In the tungsten plug technology, tungsten (W) completely fills the contact openings. Aluminum lines are formed on top of the contact openings to interconnect the tungsten-filled contacts. Therefore, in the tungsten plug technology, the aluminum layer is formed far away from the surface of the silicon substrate. For instance, the height of a tungsten plug is typically a few thousand angstroms and thus the aluminum layer can be a few thousand angstroms away from the silicon surface.

In integrated circuits incorporating digital and analog circuitry, there is often a need to form a Schottky diode in the same integrated circuit as the digital circuitry. Schottky diodes require the aluminum to be in direct contact with the silicon surface so as to form a Schottky barrier metal-silicon junction. However, when barrier metals are used or when tungsten plug contacts are used in a fabrication process, it is difficult to form good Schottky diodes because the aluminum layer no longer makes direct contact with the silicon substrate. In fabrication processes using barrier metals such as titanium, a silicide is formed at the barrier metal and silicon interface. Although the titanium silicide can form a Schottky junction, it is usually a very poor Schottky junction because the leakage current is very high and the forward bias voltage is very low.

Conventional fabrication processes for forming an ohmic contact and a Schottky diode in the same integrated circuit generally requires two or more additional masking or photolithography steps. Furthermore, the ohmic contact or the Schottky diode structure formed using the conventional fabrication processes often have undesirable step height issues which may result in yield degradation and may negatively impact reliability.

Therefore, a fabrication process that can form ohmic contact using barrier metals and/or tungsten plugs as well as Schottky junction by direct aluminum to silicon contact is desired.

Furthermore, in some applications, trimming using zener zap diodes is used to improve the accuracy and yield of precision integrated circuits. Ohmic contacts to the cathode and anode of a zener zap diode may be formed by placing aluminum in direct contact with heavily doped regions formed in the silicon substrate such as N+ or P+ diffusion region. Zener zap diodes have low to moderate breakdown voltages and are zapped to cause an aluminum filament to form between the anode and the cathode terminal to form an electrical short across the device.

The challenge of forming a zener zap diode in a fabrication process that uses barrier metals and/or tungsten plugs is the same as that of Schottky diodes. Zener zap diodes require aluminum to be in direct contact with the silicon substrate. A fabrication process that can form ohmic contact using barrier metals and/or tungsten plugs as well as zener zap diodes by direct aluminum to silicon contact is desired.

SUMMARY OF THE INVENTION

According to one embodiment of the present invention, a method for forming an ohmic contact and a Schottky diode in an integrated circuit includes providing a semiconductor substrate; forming first and second diffusion regions in the semiconductor substrate; forming an insulating layer on the semiconductor substrate; forming a first contact opening in the insulating layer to expose the semiconductor substrate where the first contact opening is formed over the first diffusion region; forming a barrier metal layer on the insulating layer and in the first contact opening; forming a second contact opening in the barrier metal layer and the insulating layer to expose the semiconductor substrate where the second contact opening is formed over the second diffusion region; forming a metal layer of a first type on the barrier metal layer and the insulating layer and in the first and second contact openings where the metal layer includes a metal that forms a Schottky barrier junction with the semiconductor substrate; and patterning the metal layer to form the ohmic contact over the first diffusion region and the Schottky diode over the second diffusion region.

According to one aspect of the present invention, the ohmic contact includes a barrier metal layer. According to another aspect of the present invention, the ohmic contact is a metal plug contact. Regardless of the ohmic contact structure, the fabrication method of the present invention can be applied to form a Schottky diode on the same semiconductor substrate as the ohmic contact.

According to another aspect of the present invention, a method for forming an ohmic contact and a zener zap diode in an integrated circuit includes providing a semiconductor substrate; forming first, second and third diffusion regions in the semiconductor substrate where the second and third diffusion regions are of opposite polarity types; forming an insulating layer on the semiconductor substrate; forming a first contact opening in the insulating layer to expose the semiconductor substrate where the first contact opening is formed over the first diffusion region; forming a barrier metal layer on the insulating layer and in the first contact opening; forming a second contact opening in the barrier metal layer and the insulating layer to expose the semiconductor substrate where the second contact opening is formed over the second diffusion region; forming a third contact opening in the barrier metal layer and the insulating layer to expose the semiconductor substrate where the third contact opening is formed over the third diffusion region; forming an aluminum layer on the barrier metal layer and the insulating layer and in the first, second and third contact openings; and patterning the aluminum layer to form the ohmic contact over the first diffusion region and the zener zap diode over the second and third diffusion regions.

The present invention is better understood upon consideration of the detailed description below and the accompanying drawings.

DETAILED DESCRIPTION OF THE PREFERRED EMBODIMENTS

In accordance with the principles of the present invention, a method for forming an ohmic contact and a Schottky diode in a fabrication process utilizing barrier metals and/or tungsten plug contacts enables a Schottky junction and an ohmic contact to be formed with only one additional masking or photolithography step. The resulting ohmic contact and Schottky diode structures have smooth step profile, eliminating undesirable step height issues associated with the conventional processes. The method of the present invention provides a simple, low cost and reliable process for forming ohmic contacts and Schottky diodes in the same integrated circuit.

The present invention will be described more fully with reference to the accompanying drawings, in which various embodiments of the present invention are shown. The accompanying drawings are provided to illustrate the processing steps for forming the ohmic contacts and Schottky diodes of the present invention and the drawings are not drawn to scale. For instance, the thickness of the layers and regions are exaggerated for clarity. Like numerals refer to like elements throughout. Furthermore, it is understood that when an element such as a layer, film, or region is referred to as being "on" another element, it can be directly on the other element or intervening elements may also be present. In contrast, when an element is referred to as being "directly on" another element, there are no intervening elements present.

In general, a Schottky diode refers to a metal-semiconductor junction where the metal forms a Schottky barrier with the semiconductor at the junction instead of an ohmic contact. The formation of a Schottky barrier depends on the metal's work function, the band gap of the intrinsic semiconductor, and the type and concentration of dopants in the semiconductor to which the metal is in contact. A variety of metals can be placed in direct contact with a semiconductor substrate, such as silicon, to form a Schottky diode. Aluminum is a commonly used metal that can form a satisfactory Schottky diode with desirable forward bias and reverse bias current-voltage (I-V) characteristics. In the following description, the term "Schottky diode" refers to a metal-semiconductor junction that forms a Schottky barrier. Furthermore, when aluminum is used to form an aluminum-semiconductor junction, the Schottky junction is referred to as an "aluminum Schottky diode" or "Al Schottky diode."

Figure 1:
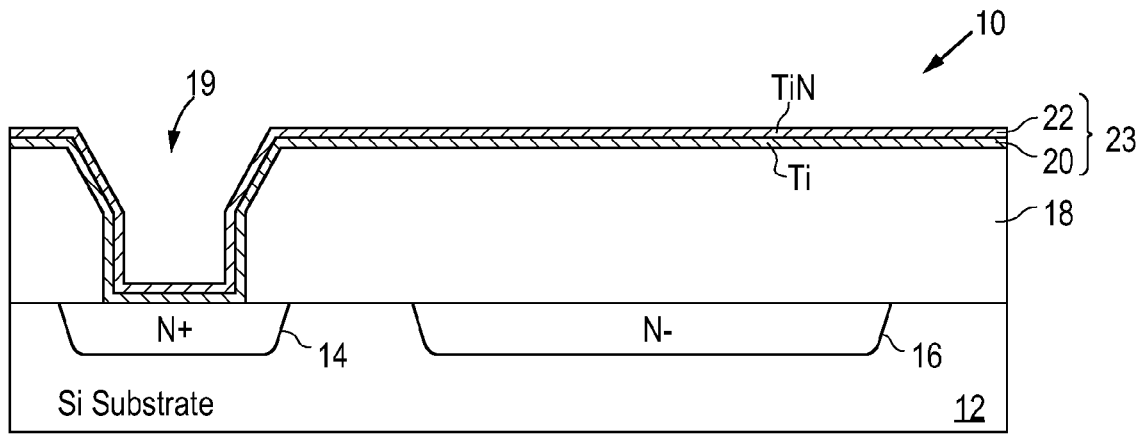
FIGS. 1-5 are cross-sectional diagrams illustrating the fabrication process for forming an ohmic contact and a Schottky diode in an integrated circuit according to a first embodiment of the present invention.

FIGS. 1-5 are cross-sectional diagrams illustrating the fabrication process for forming an ohmic contact and a Schottky diode in an integrated circuit according to a first embodiment of the present invention. Referring to FIG. 1, an integrated circuit 10 is formed on a semiconductor substrate 12, such as a silicon substrate. Substrate 12 can be an N-type or P-type substrate depending on the application. In the present illustration, an N+ diffusion region 14 is formed in substrate 12. An ohmic contact is to be formed on N+ diffusion region 14 to provide an electrical connection to the N+ diffusion region. N+ diffusion region 14 is illustrative only and is provided merely to illustrate an exemplary ohmic contact structure that can be formed on substrate 12. In general, an ohmic contact is formed to contact with N-type or P-type diffusion regions in the silicon substrate or with a polysilicon layer formed on the silicon substrate.

An N− diffusion region 16 is also formed in substrate 12 where the N− diffusion region functions as the cathode of a Schottky diode. To complete the Schottky diode, aluminum needs to be in direct contact with the N− diffusion region 16, without any intervening barrier metal layers. In the present embodiment, the fabrication process forms ohmic contacts by using a barrier metal layer of titanium (Ti) and titanium nitride (TiN) and the aluminum layer is formed over the barrier metal layer. The fabrication process of the present invention provides a simple and low cost method to allow an aluminum Schottky junction to be formed on N− diffusion region 16 using only one additional masking step, as will be described in more detail below.

After the diffusion regions are formed, an insulating layer 18 is formed over substrate 12. Insulating layer 18 is usually a silicon oxide layer, such as a BPSG layer, and can be any inter-level dielectric commonly used in semiconductor fabrication processes. A first contact opening 19 is formed in insulating layer 18 over and exposing N+ diffusion region 14. Then, a blanket deposition of a barrier metal layer 23 including a bottom titanium (Ti) layer 20 and a top titanium nitride (TiN) layer 22 is carried out. The barrier metal layer 23 covers insulating layer 18 including the first contact opening 19, as shown in FIG. 1. An annealing step, such as a rapid thermal anneal step, is usually performed so that the bottom Ti layer 20 forms a titanium silicide ($TiSi_2$) layer with the silicon substrate at the titanium-silicon interface. At this point, the ohmic contact over N+ diffusion region 14 is partially formed. The ohmic contact is complete when aluminum is deposited to fill the contact opening 19.

Figure 2:
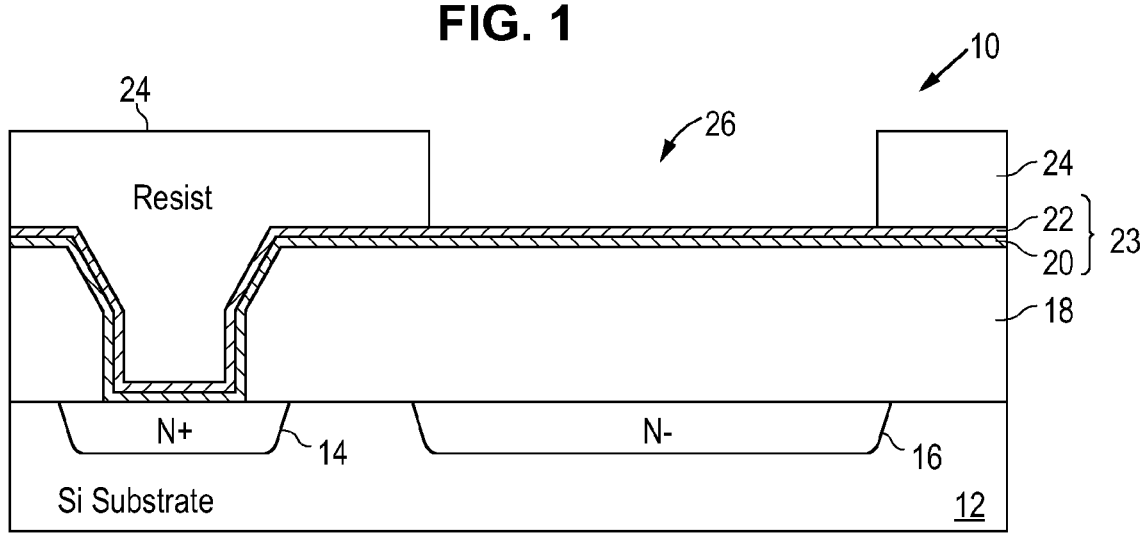

Referring now to FIG. 2, a masking/photolithography step is carried out to define areas where the Schottky diode is to be formed. Specifically, a photoresist layer 24 is formed on the top surface of the barrier metal layer 23 and the photoresist layer is patterned using a Schottky diode mask. The Schottky diode mask defines areas where the aluminum will make direct contact with the silicon substrate surface, thereby forming an aluminum Schottky diode junction. When photoresist layer 24 is patterned and developed, an opening 26 in the photoresist layer is formed over the N− diffusion region 16. Opening 26 defines the area where the Schottky junction is to be formed.

Figure 3:
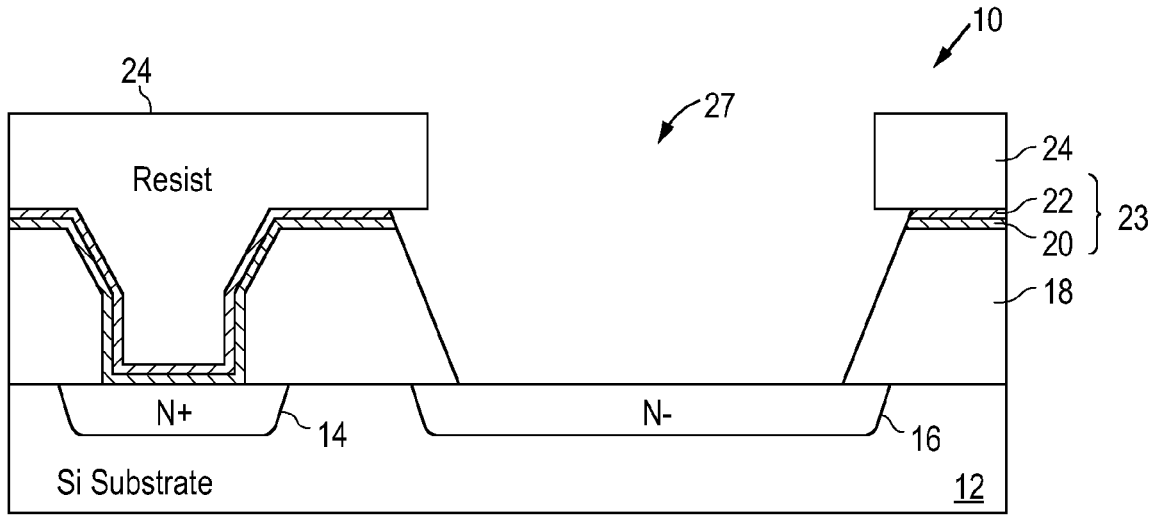

After opening 26 is defined, one or more etching processes are then carried out to remove the barrier metal layer 23 and the insulating layer 18 exposed by opening 26 and to form a contact opening for the Schottky diode. In the present embodiment, a first dry etch process using chlorine chemistry is carried out to etch through the TiN layer 22 and the Ti layer 20 and then a second dry etch process using fluorine chemistry is carried out to etch through insulating layer 18. Referring to FIG. 3, a second contact opening 27 is thus formed in the barrier metal layer and the insulating layer, exposing the silicon substrate 12 where N− diffusion region 16 is formed. The remaining photoresist layer 24 is then removed.

Figure 4:
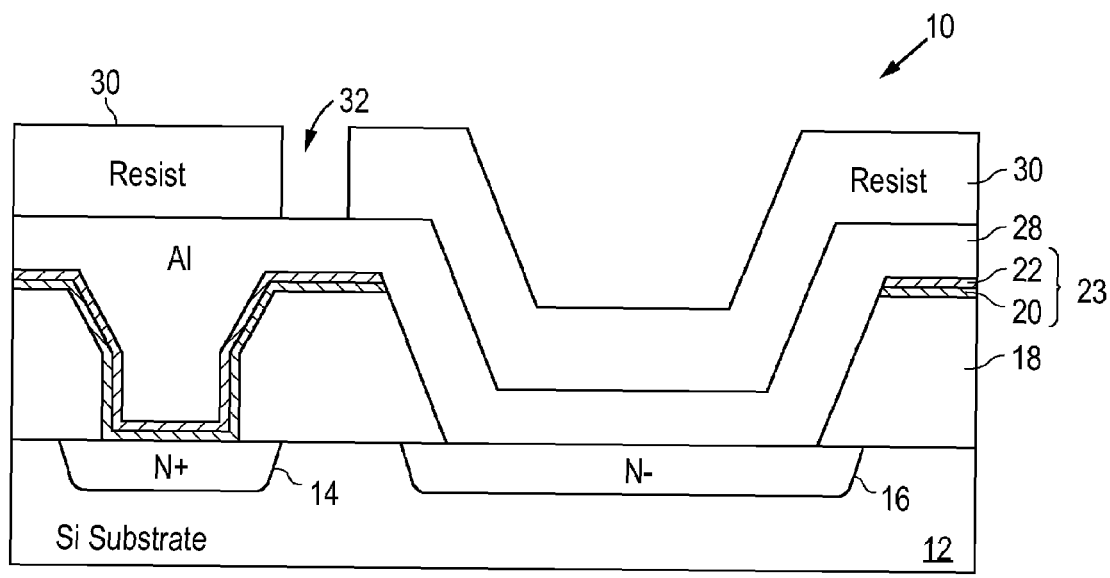

After photoresist layer 24 is removed, first contact opening 19 lined with the barrier metal layer 23 and second contact opening 27 exposing the silicon surface without any intervening layers are formed. An aluminum deposition step can then be carried out to deposit a blanket layer of aluminum 28, as shown in FIG. 4. The aluminum layer fills the contact opening 19 on top of the barrier metal layer 23 and an ohmic contact to N+ diffusion region 14 is thus formed. The aluminum layer also fills contact opening 27 and makes direct contact with the silicon substrate surface where the N− diffusion region 16 is formed. In this manner, an aluminum Schottky junction is formed in contact opening 27.

Subsequent masking and photolithography steps are carried out to pattern the aluminum layer 28 to form the desirable electrical interconnect pattern on the integrated circuit. For example, a photoresist layer 30 can be deposited on the blanket aluminum layer 28 and the photoresist layer 30 is patterned and developed to form the desired interconnect pattern including an opening 32. Etching of the aluminum layer 28 and the underlying barrier metal layer 23 is then carried out using photoresist layer 30 as a mask. After the etching steps, the photoresist layer 30 is removed to realize the final device structures, as shown in FIG. 5.

Figure 5:
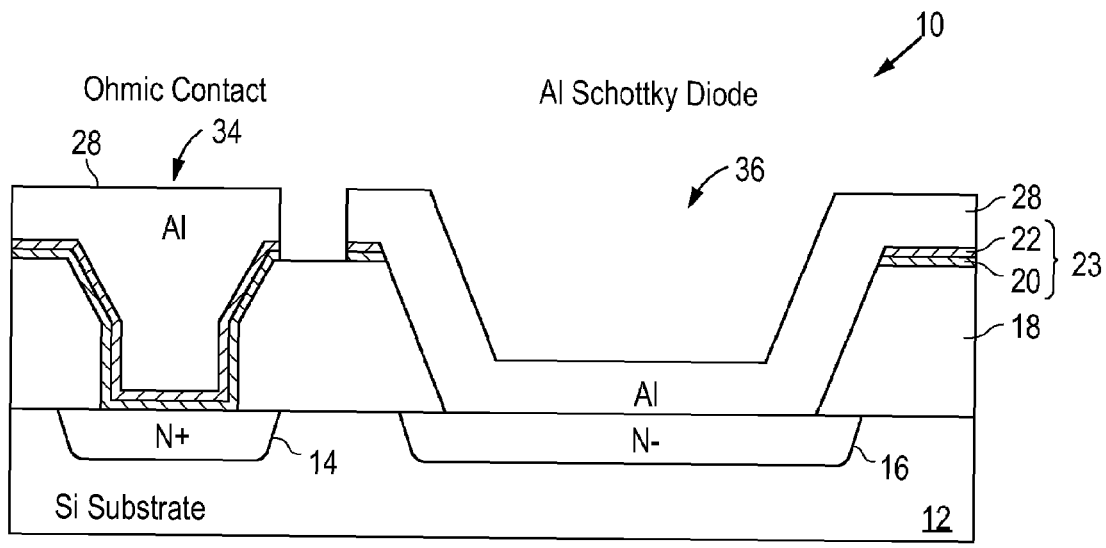

Referring to FIG. 5, an ohmic contact 34 is formed over the N+ diffusion region 14 and a Schottky diode 36 is formed over N− diffusion region 16. In the present illustration, the aluminum layer and the barrier metal layer between the ohmic contact and the Schottky diode are etched through to electrically isolate the two device structures. The integrated circuit 10 of FIG. 5 may be subjected to further processing, such as formation of a passivation layer over the aluminum layer. Other metallization and insulating layers may be sequentially formed on top of the aluminum layer, as is well known in the art.

The fabrication process of the present invention for forming an ohmic contact and a Schottky diode in the same integrated circuit realizes many advantages over conventional solutions. First, the fabrication process of the present invention requires only one additional masking step—the Schottky diode mask—to form the Schottky diodes. Second, the fabrication process of the present invention performs only one aluminum deposition step to deposit aluminum over a barrier metal layer to form an ohmic contact and to deposit aluminum over the silicon surface to form a Schottky junction. As a result, the ohmic contact and the Schottky diode structures formed using the fabrication process of the present invention have smooth step profiles, without any undesirable step height issues. The fabrication process of the present invention can thus provide a low cost and simple process for forming Schottky diodes in a barrier-metal ohmic contact process while maintaining good yield and reliability.

An important feature of the fabrication process of the present invention is that the Schottky diode thus formed has the same electrical characteristics as a Schottky diode formed using conventional processes. That is, the fabrication process of the present invention is able to form a Schottky junction in a barrier metal or tungsten plug technology without compromising diode characteristics.

Figure 10A:
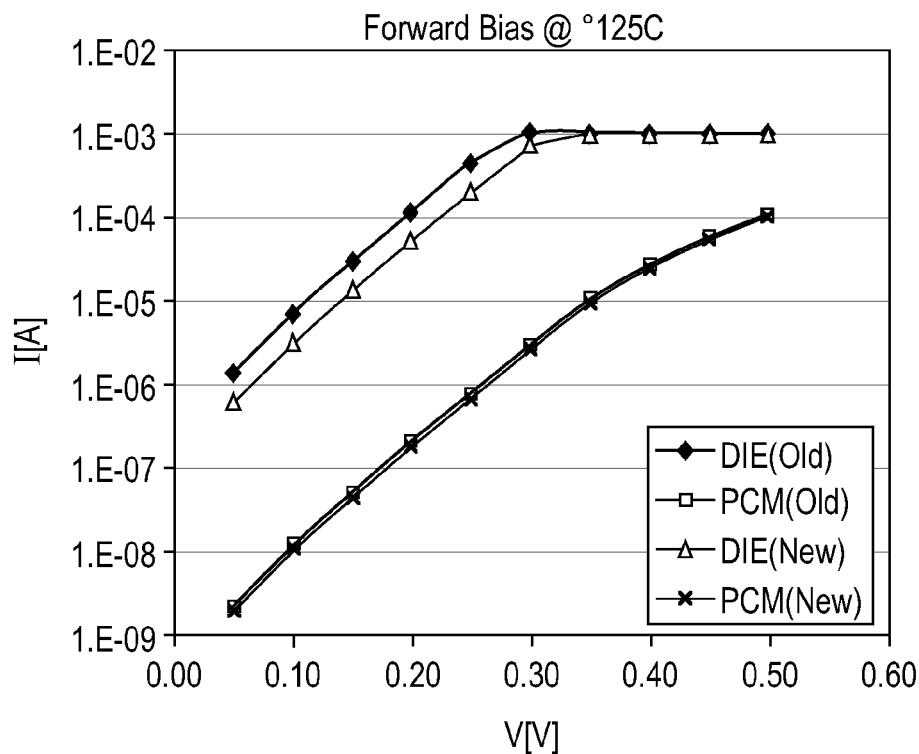
FIGS. 10A and 10B are plots illustrating the I-V characteristics of the Al Schottky diode of FIG. 5 as compared to a Schottky diode formed in a conventional manner.
Figure 10B:
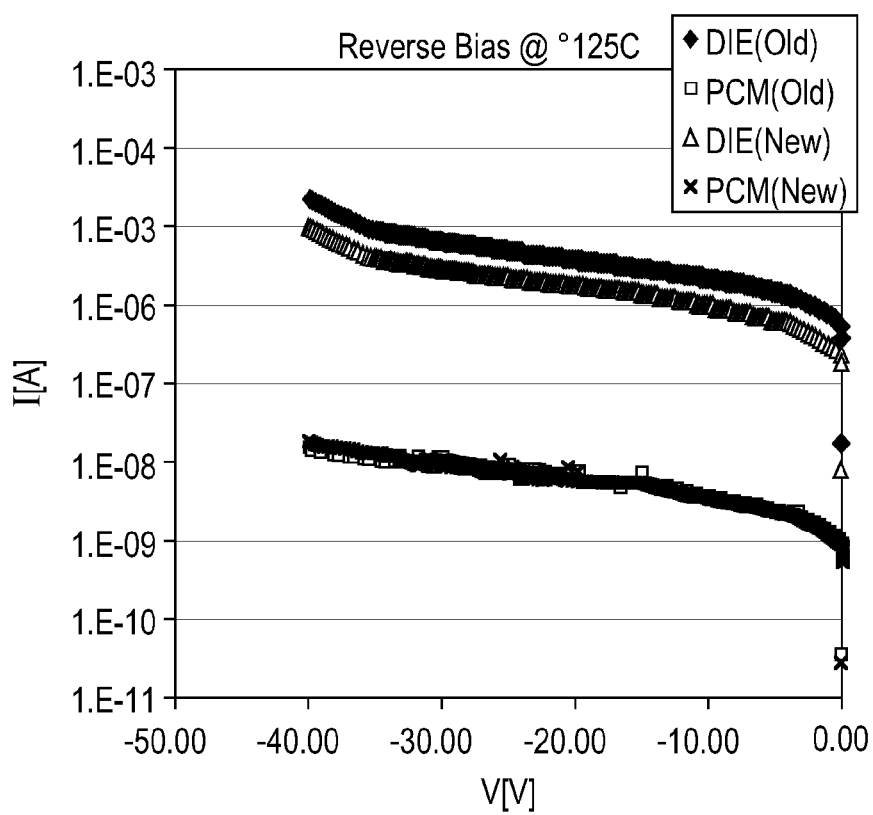

FIGS. 10A and 10B are plots illustrating the I-V characteristics of the Al Schottky diode of FIG. 5 as compared to a Schottky diode formed in a conventional process. In the present comparison, the convention process refers to a fabrication process using aluminum contact structure without any intervening barrier metals. The I-V characteristics shown in FIGS. 10A and 10B are taken at a temperature of 125° C. which is the worse case condition. FIG. 10A illustrates the forward bias I-V characteristics and FIG. 10B illustrates the reverse bias I-V characteristics. Each plot illustrates the I-V characteristics of a Schottky diode formed in the circuitry of an integrated circuit (DIE) or a Schottky diode in a test structure (PCM). As can be observed from FIGS. 10A and 10B, the fabrication process of the present invention provides comparable electrical result as the conventional process. For instance, the forward bias current of the Schottky diode formed using the process of the present invention at 125° C. is comparable to the Schottky diode formed using the conventional process. Furthermore, the reverse bias leakage current of the two Schottky diodes is also comparable. Thus, the fabrication process of the present invention is able to form a Schottky diode having the desirable Schottky diode characteristics.

In FIGS. 1-5, the fabrication process of the present invention is applied to process technologies employing barrier metal in the ohmic contact. In the following embodiments, the fabrication process of the present invention is applied to fabrication process technologies employing tungsten plug contacts. As described above, in the tungsten plug technology, tungsten (W) completely fills the contact openings. Aluminum lines are formed on top of the contact openings to interconnect the tungsten-filled contacts. The fabrication process of the present invention is applicable to process technologies employing tungsten plug contacts and allow Al Schottky diodes to be formed on the same semiconductor substrate as tungsten plug contacts.

Figure 6:
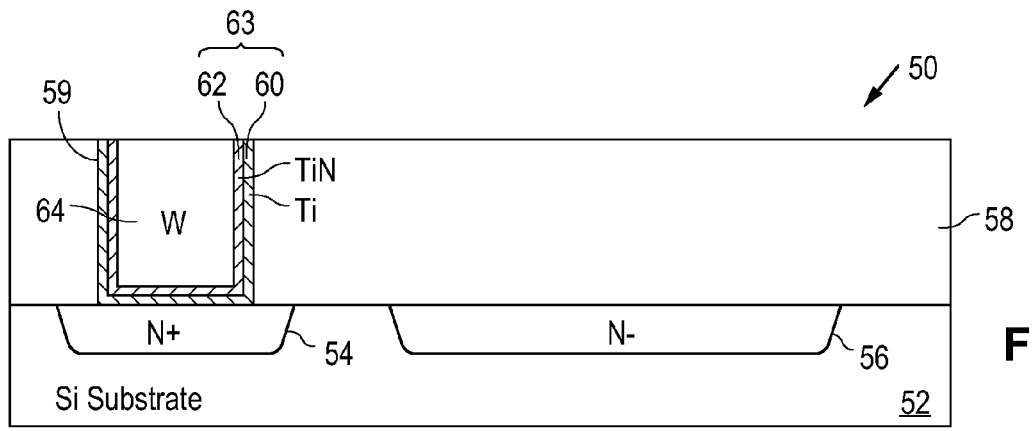
FIGS. 6-9 are cross-sectional diagrams illustrating the fabrication process for forming an ohmic contact and a Schottky diode in an integrated circuit according to a second embodiment of the present invention.

FIGS. 6-9 are cross-sectional diagrams illustrating the fabrication process for forming an ohmic contact and a Schottky diode in an integrated circuit according to a second embodiment of the present invention. Referring to FIG. 6, an integrated circuit 50 is formed on a semiconductor substrate 52, such as a silicon substrate. In the present illustration, an N+ diffusion region 54 is formed in substrate 52. An ohmic contact is to be formed on N+ diffusion region 54 to provide an electrical connection to the N+ diffusion region. N+ diffusion region 54 is illustrative only and it is understood that the ohmic contact can be formed to contact with N-type or P-type diffusion regions in the silicon substrate or with a polysilicon layer formed on the silicon substrate.

An N− diffusion region 56 is also formed in substrate 52 where the N− diffusion region functions as the cathode of a Schottky diode. To complete the Schottky diode, aluminum needs to be in direct contact with the N− diffusion region 56, without any intervening barrier metal layers. In the present embodiment, the fabrication process forms ohmic contacts by using a tungsten plug contact technology. In a tungsten plug contact technology, the aluminum layer is formed far from the substrate surface on top of the tungsten plug and the inter-level dielectric layer. The fabrication process of the present invention provides a simple and low cost method to allow an aluminum Schottky junction to be formed on N− diffusion region 56 using only one additional masking step, as will be described in more detail below.

After the diffusion regions are formed, an insulating layer 58 is formed over substrate 52. Insulating layer 58 is usually a silicon oxide layer, such as a BPSG layer, and can be any inter-level dielectric commonly used in semiconductor fabrication processes. A first contact opening 59 for a tungsten plug contact is formed in insulating layer 58 over and exposing N+ diffusion region 54. To form the tungsten plug contact, a blanket deposition of a barrier metal layer 63 including a bottom titanium (Ti) layer 60 and a top titanium nitride (TiN) layer 62 is carried out. The barrier metal layer 63 covers insulating layer 58 including the first contact opening 59, as shown in FIG. 6. An annealing step, such as a rapid thermal anneal step, is performed so that the bottom Ti layer 60 forms a titanium silicide layer with the silicon substrate at the titanium-silicon interface.

After the anneal step, a blanket tungsten deposition step is carried out so that the tungsten fills the first contact opening 59. Tungsten is also formed on top of the barrier metal layer 63 on top of insulating layer 58. An etch back process is then carried out to etch back the tungsten-titanium nitride-titanium stack that is formed on the top of the insulating layer 58 so that tungsten, titanium nitride and titanium remain only in the first contact opening 59, as shown in FIG. 6. The tungsten plug contact is thus formed.

Figure 7:
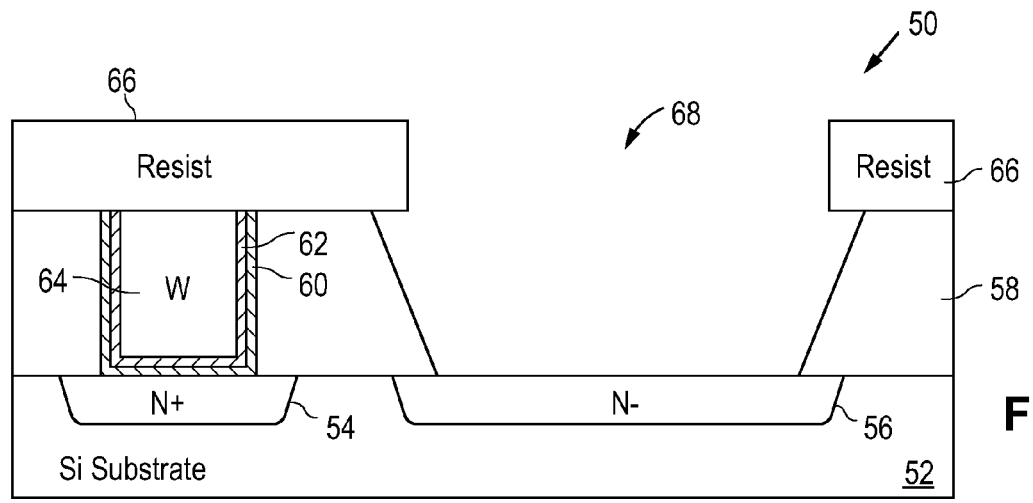

Referring now to FIG. 7, a masking/photolithography step is carried out to define areas where the Schottky diode is to be formed. Specifically, a photoresist layer 66 is formed on the top surface of the insulating layer 58 and the tungsten plug contact and the photoresist layer is patterned using a Schottky diode mask. The Schottky diode mask defines areas where the aluminum will make direct contact with the silicon substrate surface, thereby forming an aluminum Schottky diode or junction. When photoresist layer 66 is patterned and developed, an opening 68 in the photoresist layer is formed over the N− diffusion region 56. Opening 68 defines the area where the Schottky junction is to be formed.

After opening 68 is defined, one or more etching processes are then carried out to remove the insulating layer 58 exposed by opening 68 and to form a contact opening for the Schottky diode. The insulating layer 58 can be etched using a dry etch or a wet etch process, as is well known in the art. In FIG. 7, a second contact opening 68 is thus formed in the insulating layer 58, exposing the silicon substrate 52 where N− diffusion region 56 is formed. The remaining photoresist layer 66 is then removed.

Figure 8:
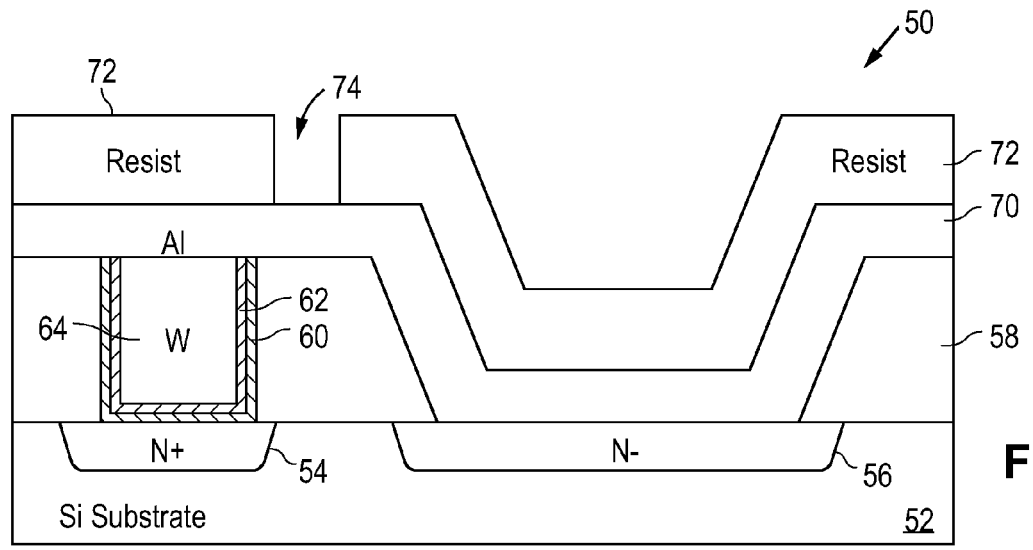

After photoresist layer 66 is removed, an aluminum deposition step is carried out to deposit a blanket layer of aluminum 70, as shown in FIG. 8. The aluminum layer is formed on top of the tungsten plug contact to form an electrical connection to the tungsten plug contact. The aluminum layer also fills the second contact opening 68 to makes direct contact with the silicon substrate surface where the N− diffusion region 56 is formed. In this manner, an aluminum Schottky junction is formed in contact opening 68.

Subsequent masking and photolithography steps are carried out to pattern the aluminum layer 70 to form the desirable electrical interconnect pattern on the integrated circuit. For example, a photoresist layer 72 can be deposited on the blanket aluminum layer 70 and the photoresist layer 72 is patterned and developed to form the desired interconnect pattern including an opening 74. Etching of the aluminum layer 70 is then carried out using photoresist layer 72 as a mask. After the etching step, the photoresist layer 72 is removed to realize the final device structures, as shown in FIG. 9.

Figure 9:
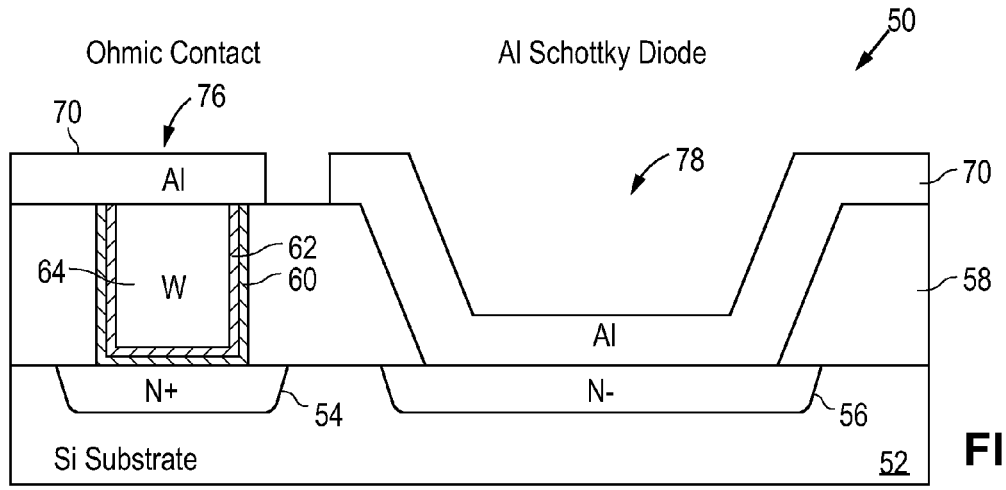

Referring to FIG. 9, an ohmic contact 76 is formed over the N+ diffusion region 54 and a Schottky diode 78 is formed over N− diffusion region 56. The integrated circuit 50 of FIG. 9 may be subjected to further processing, such as formation of a passivation layer over the aluminum layer. Other metallization and insulating layers may be sequentially formed on top of the aluminum layer, as is well known in the art.

The fabrication process of the present invention provides a simple and reliable method for forming a Schottky diode together with tungsten plug contacts. An important feature of the fabrication process of the present invention is that the Schottky diode thus formed has the same electrical characteristics as a Schottky diode formed using conventional processes. That is, the fabrication process of the present invention is able to form a Schottky junction in a barrier metal or tungsten plug technology without compromising diode characteristics.

Figure 11:
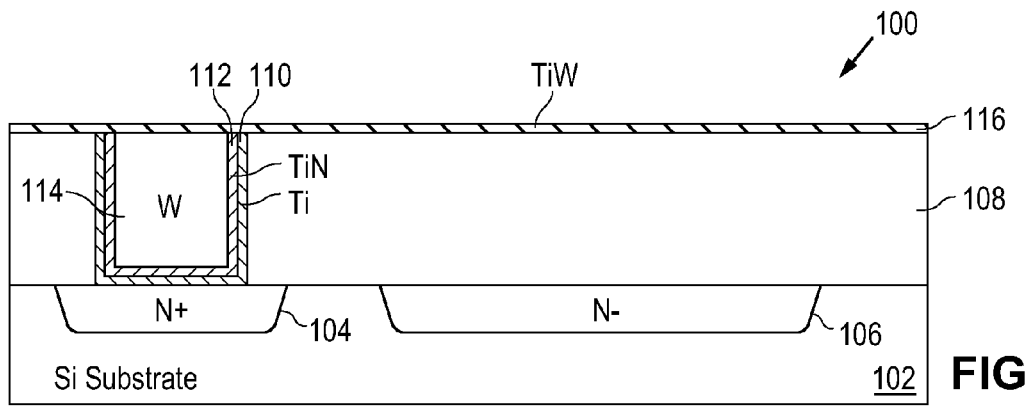
FIGS. 11-14 are cross-sectional diagrams illustrating the fabrication process for forming an ohmic contact and a Schottky diode in an integrated circuit according to a third embodiment of the present invention.
Figure 12:
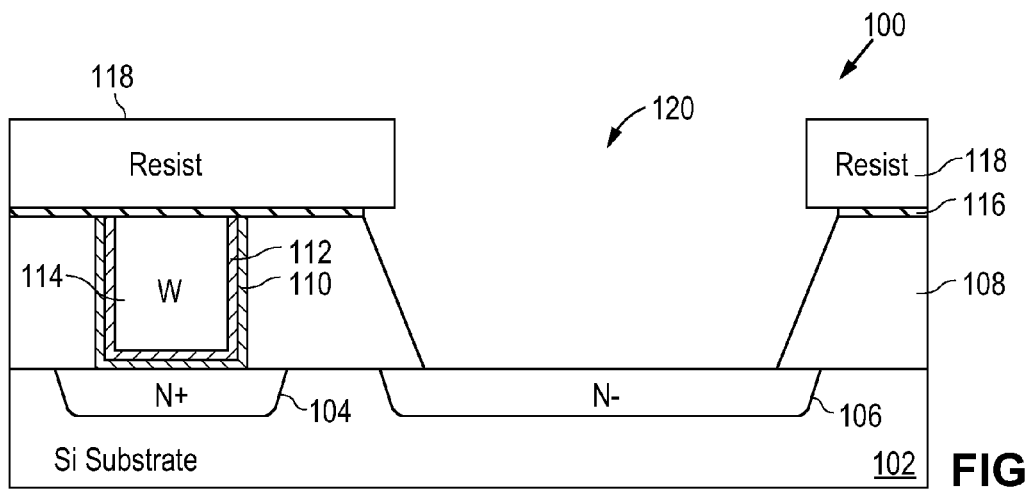

FIGS. 11-14 are cross-sectional diagrams illustrating the fabrication process for forming an ohmic contact and a Schottky diode in an integrated circuit according to a third embodiment of the present invention. In the embodiment shown in FIGS. 11-14, the fabrication process uses a tungsten plug contact as in the case of FIGS. 6-9. In FIG. 11, the process for forming the tungsten plug contact is the same as the process used in FIG. 6 and will not be further described. However, in the present embodiment, after the tungsten plug contact is formed, a titanium-tungsten (TiW) layer 116 is blanket deposited on the tungsten plug contact and the insulating layer 108. The TiW layer 116 is provided to improve the adhesion between the overlying aluminum layer and the underlying insulating layer 108.

After the blanket TiW layer 116 is formed, the fabrication process continues as previously described with reference to FIGS. 6-9. First, referring to FIG. 12, a photoresist layer 118 is deposited and patterned to form an opening defining the Schottky diode contact. Then, one or more etching steps are carried out to etch the TiW layer 116 and the insulating layer 108 using photoresist layer 118 as a mask. As a result, a second contact opening 120 is formed in the TiW layer 116 and the insulating layer 108 exposing the surface of substrate 102 where N− diffusion region 106 is formed.

Figure 13:
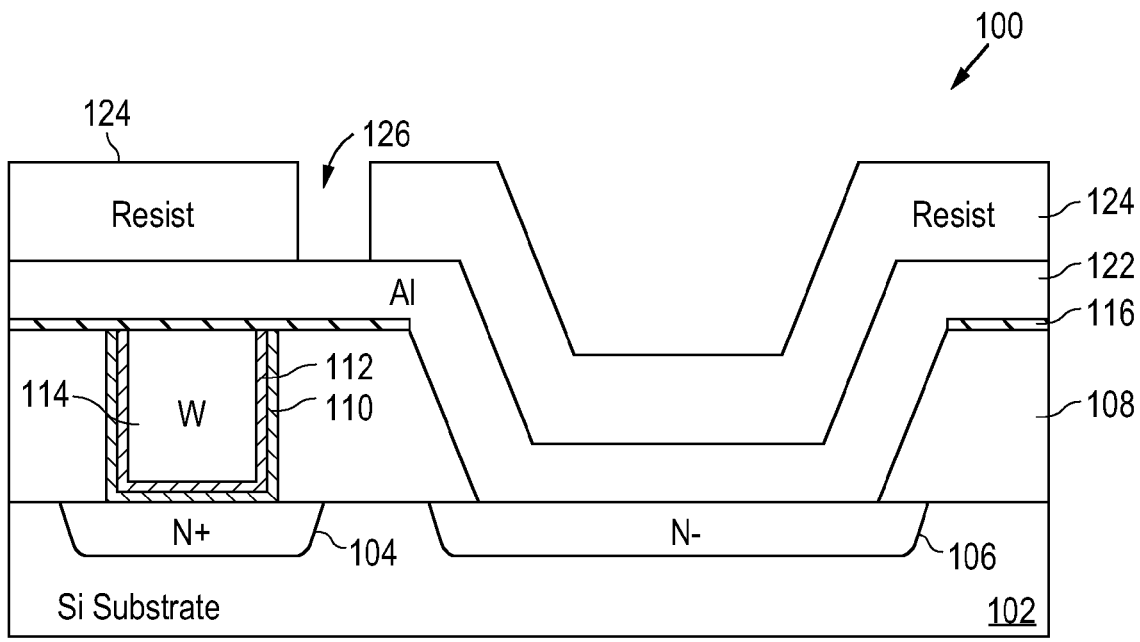

After photoresist layer 118 is removed, an aluminum deposition step is carried out to deposit a blanket layer of aluminum 122, as shown in FIG. 13. The aluminum layer is formed on top of the TiW layer 116 and forms an electrical connection to the tungsten plug contact. The aluminum layer also fills the second contact opening 120 to makes direct contact with the silicon substrate surface where the N− diffusion region 106 is formed. In this manner, an aluminum Schottky junction is formed in contact opening 120.

Subsequent masking and photolithography steps are carried out to pattern the aluminum layer 122 to form the desirable electrical interconnect pattern on the integrated circuit. For example, a photoresist layer 124 can be deposited on the blanket aluminum layer 122 and the photoresist layer 124 is patterned and developed to form the desired interconnect pattern including an opening 126. Etching of the aluminum layer 122 and the underlying TiW layer 116 is then carried out using photoresist layer 124 as a mask. After the etching step, the photoresist layer 124 is removed to realize the final device structures, as shown in FIG. 14.

Figure 14:
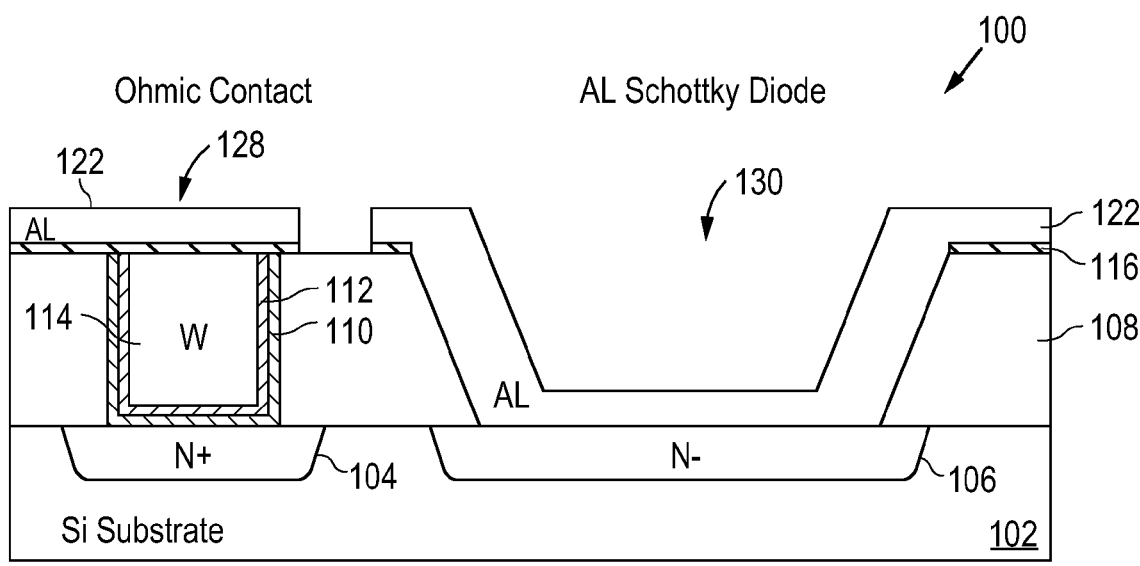

Referring to FIG. 14, an ohmic contact 128 is formed over the N+ diffusion region 104 and a Schottky diode 130 is formed over N− diffusion region 106. The integrated circuit 100 of FIG. 14 may be subjected to further processing, such as formation of a passivation layer over the aluminum layer. Other metallization and insulating layers may be sequentially formed on top of the aluminum layer, as is well known in the art.

Figure 15:
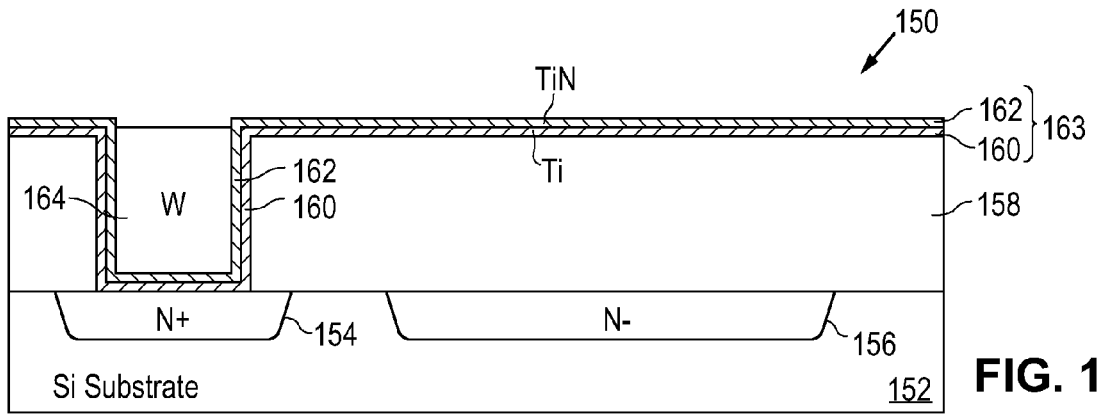
FIGS. 15-19 are cross-sectional diagrams illustrating the fabrication process for forming an ohmic contact and a Schottky diode in an integrated circuit according to a fourth embodiment of the present invention.
Figure 16:
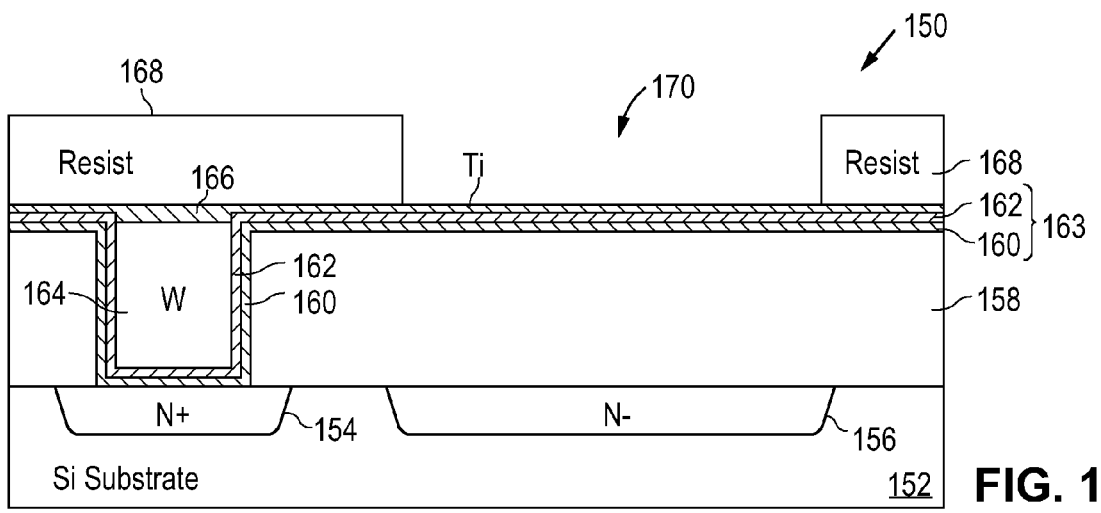

FIGS. 15-19 are cross-sectional diagrams illustrating the fabrication process for forming an ohmic contact and a Schottky diode in an integrated circuit according to a fourth embodiment of the present invention. In the embodiment shown in FIGS. 11-14, the fabrication process uses a tungsten plug contact as in the case of FIGS. 6-9. In FIG. 15, the process for forming the tungsten plug contact is the same as the process used in FIG. 6 and will not be further described. However, in the present embodiment, the tungsten plug contact is formed by etching backing only the tungsten layer 164. The barrier metal layer 163, including a bottom Ti layer 160 and a top TiN layer 162, remains on the top surface of the insulating layer 158 after the tungsten is etched back. After the tungsten etch back, a second titanium layer 166 is blanket deposited on the tungsten plug contact and the barrier metal layer 163 formed on the insulating layer 158. As a result, the tungsten plug contact is capped by the Ti layer 166 while a sandwich layer of Ti—TiN—Ti is formed on the insulating layer 158.

Figure 17:
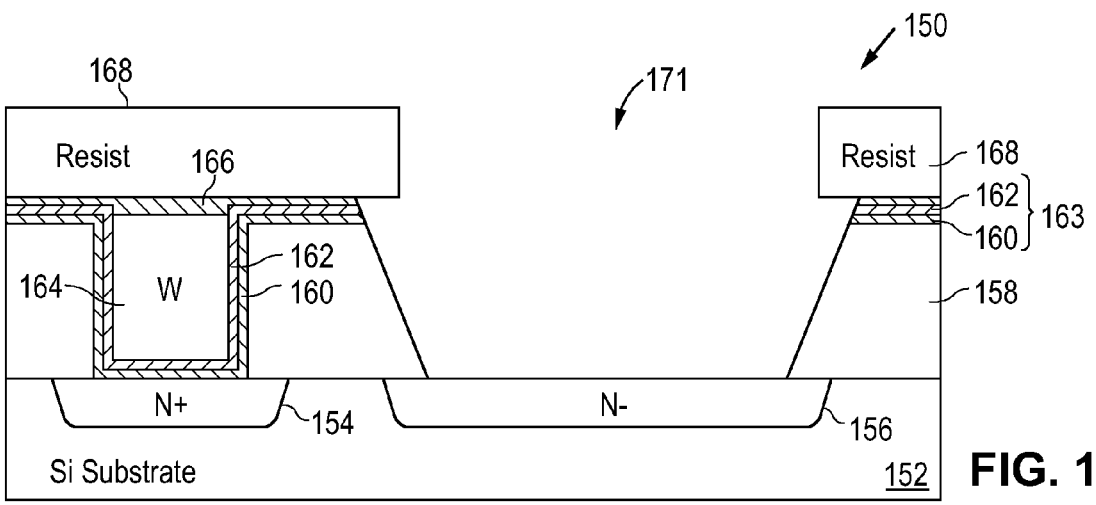

After the blanket Ti layer 166 is formed, the fabrication process continues as previously described with reference to FIGS. 6-9. First, referring to FIG. 16, a photoresist layer 168 is deposited and patterned to form an opening 170 defining the Schottky diode contact. Then, one or more etching steps are carried out to etch the sandwich Ti—TiN—Ti layer 166-162-160 and the insulating layer 158 using photoresist layer 168 as a mask. As a result, as shown in FIG. 17, a second contact opening 171 is formed in the barrier metal layers and the insulating layer 158 exposing the surface of substrate 152 where N− diffusion region 156 is formed.

Figure 18:
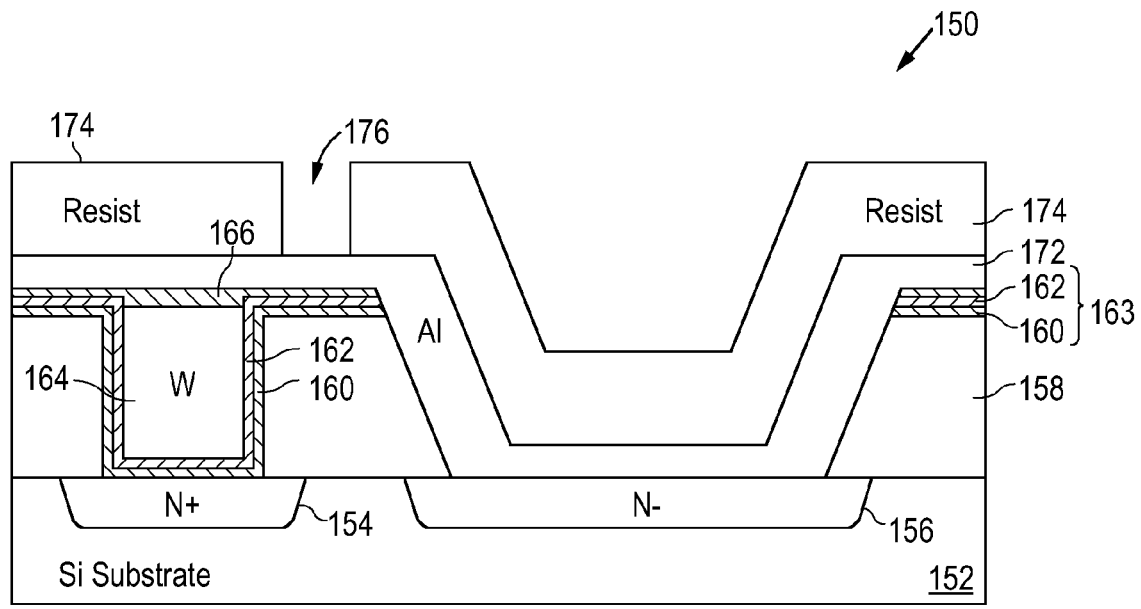

After photoresist layer 168 is removed, an aluminum deposition step is carried out to deposit a blanket layer of aluminum 172, as shown in FIG. 18. The aluminum layer is formed on top of the Ti layer 166 and forms an electrical connection to the tungsten plug contact. The aluminum layer also fills the second contact opening 171 to makes direct contact with the silicon substrate surface where the N− diffusion region 156 is formed. In this manner, an aluminum Schottky junction is formed in contact opening 171.

Subsequent masking and photolithography steps are carried out to pattern the aluminum layer 172 to form the desirable electrical interconnect pattern on the integrated circuit. For example, a photoresist layer 174 can be deposited on the blanket aluminum layer 172 and the photoresist layer 174 is patterned and developed to form the desired interconnect pattern including an opening 176. Etching of the aluminum layer 172 and the underlying Ti—TiN—Ti sandwich layer is then carried out using photoresist layer 174 as a mask. After the etching step, the photoresist layer 174 is removed to realize the final device structures, as shown in FIG. 19.

Figure 19:
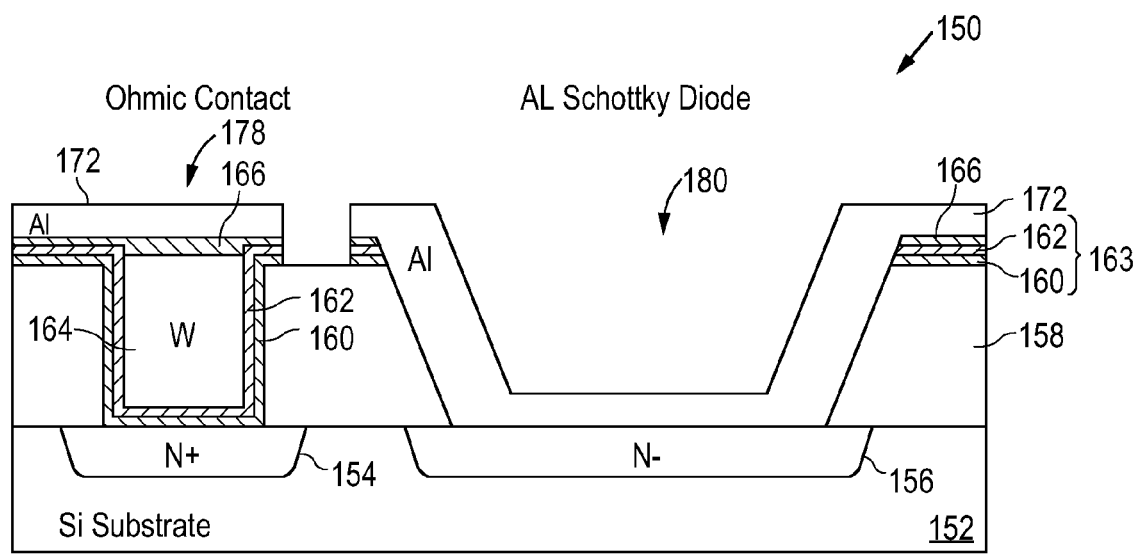

Referring to FIG. 19, an ohmic contact 178 is formed over the N+ diffusion region 154 and a Schottky diode 180 is formed over N− diffusion region 156. The integrated circuit 150 of FIG. 19 may be subjected to further processing, such as formation of a passivation layer over the aluminum layer. Other metallization and insulating layers may be sequentially formed on top of the aluminum layer, as is well known in the art.

ALTERNATE EMBODIMENTS

In the above descriptions, different embodiments of the fabrication process of the present invention for forming an ohmic contact and an aluminum Schottky diode in an integrated circuit are described. However, the above descriptions are illustrative only and are not intended to be limiting. The fabrication process of the present invention can be applied to form Schottky diodes using other suitable metals besides aluminum. For instance, a Schottky barrier junction can be used using various silicides or disilicides as metal for the metal-semiconductor junction. The silicides and disilicides that can be used include PtSi, $Pd_2Si$, $WSi_2$, $MoSi_2$, $TaSi_2$ but not $TiSi_2$. $TiSi_2$, as described above, does not form a satisfactory Schottky barrier junction.

Furthermore, in the above descriptions, a barrier metal layer of titanium and titanium nitride is used in the ohmic contacts. In other embodiments, different material composition and processes can be used to form the barrier metal layer in the ohmic contacts. For example, cobalt (Co) can be used as a barrier metal layer and cobalt silicide ($CoSi_2$) is formed at the ohmic contact junction. The use of a Ti/TiN layer as the barrier metal layer in the above description is illustrative only. The fabrication process of the present invention can be practiced in all types of barrier metal contact technologies and enables a single metal deposition step to be used for both the ohmic contact with the barrier metal layer and the Schottky diode without the barrier metal layer.

Moreover, the fabrication process of the present invention can be practiced in all types of metal plug contact technologies utilizing all types of metals that are suitable for filling plug contacts, such as tungsten and copper plug contacts. The above described embodiments illustrate three types of tungsten plug contact structures and they are illustrative only. The fabrication process of the present invention can be practiced with other types of metal plug contacts and enables a Schottky diode to be formed in a fabrication process utilizing metal plug technologies.

Zener Zap Diode

According to another aspect of the present invention, the fabrication process for forming an ohmic contact and a Schottky diode in an integrated circuit is applied to form a zener zap diode with an ohmic contact in the same integrated circuit. As described above, a zener zap diode is formed by bringing aluminum in direct contact with heavily doped silicon regions on the substrate, without any intervening barrier metal layer. The fabrication process of the present invention can thus be applied to form a zener zap diode in an integrated circuit while ohmic contacts are also being formed on the same integrated circuit.

Figure 20:
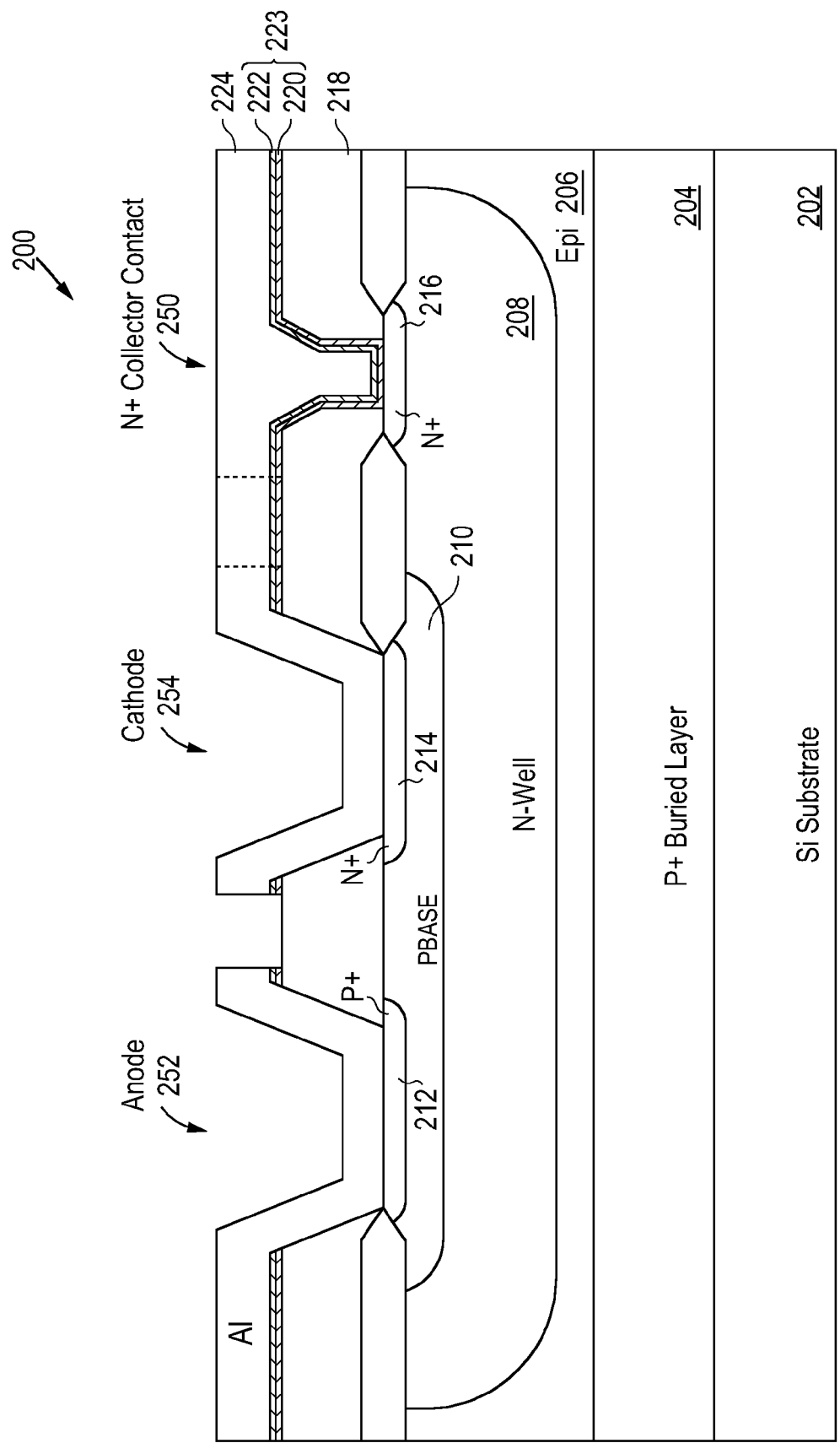
FIG. 20 is a cross-sectional diagram illustrating a zener zap diode and an ohmic contact formed in an integrated circuit according to an alternate embodiment of the present invention.

FIG. 20 is a cross-sectional diagram illustrating a zener zap diode and an ohmic contact formed in an integrated circuit according to an alternate embodiment of the present invention. Referring to FIG. 20, an integrated circuit 200 is formed on a semiconductor substrate 202, such as a silicon substrate. Substrate 202 can be an N-type or P-type substrate depending on the application. In the present illustration, a P+ buried layer 204 is formed in substrate 202 and then a P-type epitaxial layer 206 is formed on top of the buried layer. The use of a buried layer and an epitaxial layer is optional and is not critical to the practice of the present invention. The zener zap diode is formed in an N-well 208 formed in epitaxial layer 206. A PBASE diffusion region 210 is formed in which the anode (P+) diffusion region 212 and the cathode (N+) diffusion region 214 is provided. PBASE diffusion region 210 is typically more lightly doped than the anode and cathode diffusion regions. An N+ collector diffusion region 216 is formed in the N-well.

To form the zener zap diode, an ohmic contact is to be formed on N+ collector diffusion region 216 to provide an electrical connection to the N+ collector diffusion region and aluminum contacts, without any intervening barrier metal layers, are to be formed on the P+ anode and the N+ cathode regions 212 and 214. In the present embodiment, the fabrication process forms ohmic contacts by using a barrier metal layer of titanium (Ti) and titanium nitride (TiN) and the aluminum layer is formed over the barrier metal layer. The fabrication process of the present invention provides a simple and low cost method to allow a zener zap diode to be formed in integrated circuit 200 using only one additional masking step.

After the diffusion regions are formed, an insulating layer 218 is formed over substrate 202. Insulating layer 218 is usually a silicon oxide layer, such as a BPSG layer, and can be any inter-level dielectric commonly used in semiconductor fabrication processes. Then, the process for forming the ohmic contact is first carried out. An opening in insulating layer 218 is formed over and exposing N+ collector diffusion region 216. Then, a blanket deposition of a barrier metal layer 223 including a bottom titanium (Ti) layer 220 and a top titanium nitride (TiN) layer 222 is carried out. The barrier metal layer 223 covers insulating layer 218 and the contact opening. An annealing step, such as a rapid thermal anneal step, is usually performed so that the bottom Ti layer 220 forms a titanium silicide (TiSi$_2$) layer with the silicon substrate at the titanium-silicon interface. At this point, the ohmic contact over N+ diffusion region 216 is partially formed. The ohmic contact is complete when aluminum is deposited to fill the contact opening.

Then, in accordance with the fabrication process of the present invention, a masking/photolithography step is carried out to define areas where the anode and cathode of the zener zap diode, requiring direct aluminum contacts, are to be formed. Specifically, the barrier metal layer 223 and the insulating layer 218 are patterned using a zener zap diode mask defining areas where the aluminum will make direct contact with the silicon substrate surface. Thus, a first contact opening is formed over anode diffusion region 212 and a second contact opening is formed over cathode diffusion region 214. An aluminum deposition step can now be carried out to deposit a blanket layer of aluminum 224 on integrated circuit 200. The aluminum layer fills the first and second contact openings over the anode and cathode diffusion regions and also the ohmic contact opening over the N+ collector diffusion region. In this manner, aluminum contacts are formed over the anode and the cathode regions of the zener zap diode while an ohmic contact is formed over N+ collector diffusion region 216.

Subsequent masking and photolithography steps are carried out to pattern the aluminum layer 224 to form the desirable electrical interconnect pattern on the integrated circuit 200. For example, the blanket aluminum layer can be patterned to electrically isolate the anode terminal and the cathode terminal of the zener zap diode, as shown in FIG. 20.

Referring to FIG. 20, an ohmic contact 250 is formed over the N+ collector diffusion region 216 and aluminum contacts 252 and 254 are formed over P+ anode diffusion region 212 and the N+ cathode diffusion region 214. The integrated circuit 200 of FIG. 20 may be subjected to further processing, such as formation of a passivation layer over the aluminum layer. Other metallization and insulating layers may be sequentially formed on top of the aluminum layer, as is well known in the art.

In the present illustration, the cathode of a zener zap diode is electrically shorted to the N+ collector region by the aluminum layer 224 and the barrier metal layer 223. In other embodiments, the cathode is electrically isolated from the collector region, such as by removing the aluminum and barrier metal layers between the two dotted vertical lines, as shown in FIG. 20. The zener zap diode can be zapped in the forward or reverse bias direction.

Figure 21:
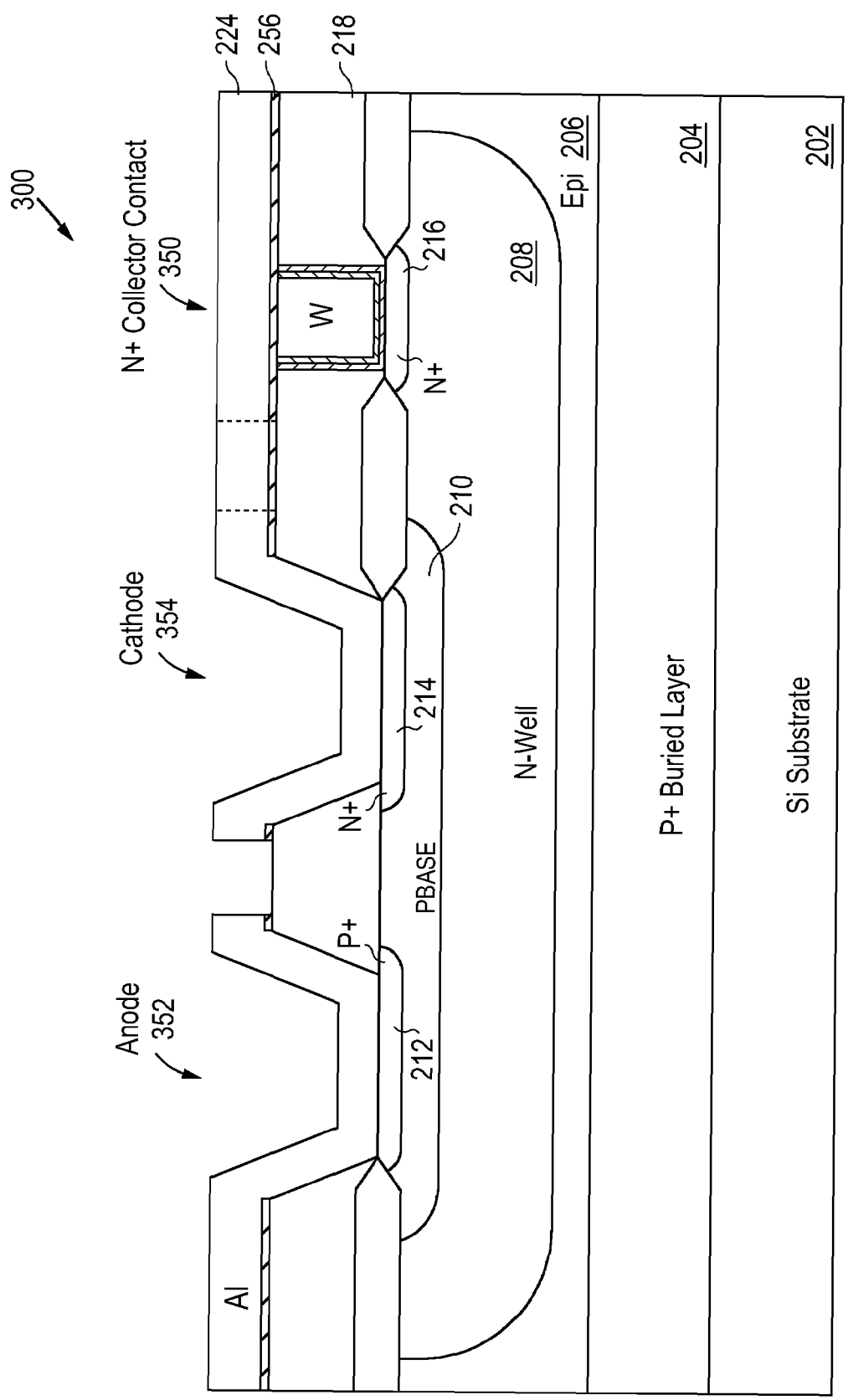
FIG. 21 is a cross-sectional diagram illustrating a zener zap diode and an ohmic contact formed in an integrated circuit according to a second alternate embodiment of the present invention.

FIG. 20 illustrates the application of the fabrication process of the present invention for forming a zener zap diode in a fabrication process that uses a barrier metal layer to form ohmic contacts. The above description is illustrative only and is not intended to be limiting. In other embodiments, the fabrication process of the present invention can be applied to form a zener zap diode when the ohmic contacts are formed using metal plug technologies, as described above with reference to FIGS. 6-9 and 11-19. FIG. 21 illustrates a zener zap diode (anode 352 and cathode 354) and a tungsten plug contact 350 formed in an integrated circuit 300 using the fabrication process of the present invention in an alternate embodiment. The description of the fabrication process of the present invention above with reference to FIGS. 1-19 is applicable for forming a zener zap diode in place of the Schottky diode in the integrated circuit. In the case of the zener zap diode, aluminum is the preferred metal for forming the direct metal contact.

The above detailed descriptions are provided to illustrate specific embodiments of the present invention and are not intended to be limiting. Numerous modifications and variations within the scope of the present invention are possible. The present invention is defined by the appended claims.

I claim:

1. A method for forming an ohmic contact and a Schottky diode in an integrated circuit, comprising:

providing a semiconductor substrate;

forming first and second diffusion regions in the semiconductor substrate;

forming an insulating layer on the semiconductor substrate;

forming a first contact opening in the insulating layer to expose the semiconductor substrate, the first contact opening being formed over the first diffusion region;

forming a barrier metal layer on the insulating layer and in the first contact opening;

forming a second contact opening in the barrier metal layer and the insulating layer to expose the semiconductor substrate, the second contact opening being formed over the second diffusion region;

forming a metal layer of a first type on the barrier metal layer and the insulating layer and in the first and second contact openings, the metal layer comprising a metal that forms a Schottky barrier junction with the semiconductor substrate; and patterning the metal layer to form the ohmic contact over the first diffusion region and the Schottky diode over the second diffusion region.

2. The method of claim 1, wherein the metal layer of the first type comprises an aluminum layer.

3. The method of claim 1, wherein the baffler metal layer comprises a titanium (Ti) layer and a titanium nitride (TiN) layer formed on the titanium layer.

4. The method of claim 3, wherein the ohmic contact comprises a metal plug contact and wherein after forming the baffler metal layer and before forming the second contact opening, the method further comprises:
 forming a metal layer of a second type, different than the first type, on the barrier metal layer and in the first contact opening; and
 removing the metal layer of the second type and the baffler metal layer on the insulating layer, leaving the metal layer of the second type and the barrier metal layer in the first contact opening to form the metal plug contact in the first contact opening,
 wherein forming the second contact opening comprises forming the second contact opening in the insulating layer.

5. The method of claim 4, wherein after removing the metal layer of the second type and the barrier metal layer on the insulating layer to form the metal plug contact in the first contact opening, the method further comprises:
 forming a second baffler metal layer on the insulating layer and the metal plug contact,
 wherein forming the second contact opening comprises forming the second contact opening in the second barrier metal layer and the insulating layer.

6. The method of claim 5, wherein the second barrier metal layer comprises a titanium-tungsten (TiW) layer.

7. The method of claim 4, wherein the metal layer of the first type comprises an aluminum layer and the metal layer of the second type comprises a tungsten layer or a copper layer.

8. The method of claim 2, wherein the ohmic contact comprises a metal plug contact and wherein after forming the baffler metal layer and before forming the second contact opening, the method further comprises:
 forming a metal layer of a second type, different than the first type, on the barrier metal layer and in the first contact opening;
 removing the metal layer except in the first contact opening to form the metal plug contact in the first contact opening;
 forming a second barrier metal layer on the barrier metal layer and the metal plug contact,
 wherein forming the second contact opening comprises forming the second contact opening in the second baffler metal layer, the baffler metal layer and the insulating layer.

9. The method of claim 8, wherein the baffler metal layer comprises a titanium (Ti) layer and a titanium nitride (TiN) layer formed on the titanium layer and the second baffler metal layer comprises a titanium (Ti) layer.

10. The method of claim 8, wherein the metal layer of the first type comprises an aluminum layer and the metal layer of the second type comprises a tungsten layer or a copper layer.

11. The method of claim 1, wherein the second diffusion region comprises a lightly doped N− diffusion region.

12. The method of claim 1, wherein the first diffusion region comprises a heavily doped N+ diffusion region.

13. The method of claim 1, wherein the first diffusion region comprises a heavily doped P+ diffusion region.

* * * * *

UNITED STATES PATENT AND TRADEMARK OFFICE
CERTIFICATE OF CORRECTION

PATENT NO. : 7,479,444 B2
APPLICATION NO. : 11/421707
DATED : January 20, 2009
INVENTOR(S) : Schyi-yi Wu It is certified that error appears in the above-identified patent and that said Letters Patent is hereby corrected as shown below:

Column 13, line 1, claim 3: Cancel "baffler" and substitute --barrier--.

Column 13, line 6, claim 4: Cancel "baffler" and substitute --barrier--.

Column 13, line 11, claim 4: Cancel "baffler" and substitute --barrier--.

Column 13, line 23, claim 5: Cancel "baffler" and substitute --barrier--.

Column 14, line 3, claim 8: Cancel "baffler" and substitute --barrier--.

Column 14, line 14, claim 8: Cancel "baffler" and substitute --barrier--.

Column 14, line 17, claim 9: Cancel "baffler" and substitute --barrier--.

Column 14, line 19, claim 9: Cancel "baffler" and substitute --barrier--.

Signed and Sealed this

Twenty-eighth Day of April, 2009

JOHN DOLL
*Acting Director of the United States Patent and Trademark Office*